US009919511B1

(12) United States Patent
King et al.

(10) Patent No.: US 9,919,511 B1
(45) Date of Patent: Mar. 20, 2018

(54) STENCIL PRINTER HAVING CONTROLLABLE TENSION DEVICE FOR A STENCIL WIPER ASSEMBLY AND METHOD OF CONTROLLING TENSION

(71) Applicant: Illinois Tool Works Inc., Glenview, IL (US)

(72) Inventors: Kenneth King, East Freetown, MA (US); Thomas C. Prentice, Westford, MA (US); Patsy A. Mattero, Smithfield, RI (US); William A. Losiewicz, Douglas, MA (US); James Lynch, Uxbridge, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/423,119

(22) Filed: Feb. 2, 2017

(51) Int. Cl.
*B41F 15/12* (2006.01)
*B65H 23/08* (2006.01)
*B41F 15/44* (2006.01)
*B41F 15/18* (2006.01)
*B41F 35/00* (2006.01)

(52) U.S. Cl.
CPC .............. *B41F 15/44* (2013.01); *B41F 15/12* (2013.01); *B41F 15/18* (2013.01); *B41F 35/003* (2013.01); *B41F 35/005* (2013.01); *B65H 23/08* (2013.01); *B65H 23/085* (2013.01)

(58) Field of Classification Search
CPC .......... B41F 15/44; B41F 15/18; B41F 15/08; B41F 15/12; B41F 35/003; B41F 35/005; B41P 2235/24; B41P 2235/242; B41P 2235/244; B41P 2235/246; B65H 23/06; B65H 23/063; B65H 23/066; B65H 23/08; B65H 23/085
USPC ......................................... 101/123, 425, 423
See application file for complete search history.

(56) References Cited

U.S. PATENT DOCUMENTS

| 5,150,650 | A | * | 9/1992 | Murakami | ................ | B08B 1/00 101/423 |
| 5,918,544 | A | | 7/1999 | Doyle | | |
| 6,036,787 | A | * | 3/2000 | Bennett | .................. | B41F 35/005 101/423 |
| 6,588,338 | B2 | * | 7/2003 | Schmutz | ................. | B41F 35/00 101/423 |
| 2005/0126412 | A1 | * | 6/2005 | Ruschkowski | ......... | B41F 35/00 101/425 |
| 2008/0105150 | A1 | * | 5/2008 | Nadolny | ................. | B41F 35/00 101/423 |
| 2009/0260528 | A1 | * | 10/2009 | Baccini | ..................... | B08B 1/02 101/126 |

* cited by examiner

*Primary Examiner* — Leslie J Evanisko
(74) *Attorney, Agent, or Firm* — Lando & Anastasi, LLP

(57) ABSTRACT

A stencil printer includes a stencil, a material applicator to apply material on the stencil, and a stencil wiper assembly to selectively wipe the stencil. The stencil wiper assembly includes has a quick-change material module having a supply roller to receive a roll of material, a take-up roller to receive used material, a drive to move the material across the stencil from the supply roller to the take-up roller, and a controllable tension device configured to vary a tension of the material when driving the material from the supply roller to the take-up roller.

11 Claims, 9 Drawing Sheets

STENCIL PRINTER HAVING CONTROLLABLE TENSION DEVICE FOR A STENCIL WIPER ASSEMBLY AND METHOD OF CONTROLLING TENSION

BACKGROUND OF DISCLOSURE

1. Field of Disclosure

This disclosure relates generally to stencil cleaning methods and apparatus, and more particularly to a stencil printer having a controllable tension device for a stencil wiper assembly.

2. Discussion of Related Art

In a typical surface-mount circuit board manufacturing operation, a stencil printer is used to print solder paste onto a circuit board having a pattern of pads or some other conductive surface onto which solder paste may be deposited. The circuit board is automatically fed into the stencil printer and one or more small holes or marks on the circuit board, called fiducials, may be used to properly align the circuit board with the stencil or screen of the stencil printer prior to the printing of solder paste onto the circuit board. In a typical stencil printing process, once a circuit board has been properly aligned with the stencil in the printer, the circuit board is raised to the stencil (or the stencil may be lowered to the circuit board), solder paste is dispensed onto the stencil from a solder paste cartridge, and a wiper blade or squeegee traverses the stencil to force the solder paste through apertures formed in the stencil and thereby onto the circuit board. In an unpressurized system, as the squeegee is moved across the stencil, the solder paste tends to roll in front of the blade, which desirably causes mixing and shearing of the solder paste so as to attain desired viscosity to facilitate filling of the apertures in the screen or stencil.

In some stencil printers, any excess solder paste remaining under the squeegee after it has fully traversed the stencil, remains on the stencil when the squeegee is returned to its initial position for printing on a subsequent circuit board. In some instances, as the squeegee passes the solder paste over the apertures when returning to its initial position, minute amounts of solder paste may seep through the apertures to accumulate at the bottom side of the stencil. This presents various problems such as the solder paste being inadvertently disposed on the unintended areas of the circuit boards. Also, as the solder paste hardens, it complicates the alignment procedure of a circuit board with the stencil. Also, such hardened solder paste may jeopardize the quality of subsequent printing operations. Therefore, it is highly desirable to remove the excess solder paste that forms on the bottom of the stencil.

U.S. Pat. No. 5,918,544 to Doyle represents one prior art stencil printer having a well-known method and apparatus for cleaning the bottom of the stencil. Doyle discloses a stencil wiping system that is positioned near the vicinity of the stencil and moves beneath the stencil from one end of the stencil to the other end. As the stencil wiper system moves beneath the stencil, excess solder paste at the bottom of the stencil is wiped off to clean the bottom of the stencil.

SUMMARY OF THE DISCLOSURE

One aspect of the present disclosure is directed to a stencil printer comprising a stencil, a material applicator to apply material on the stencil, and a stencil wiper assembly to selectively wipe the stencil. In one embodiment, the stencil wiper assembly has a quick-change material module comprising a supply roller to receive a roll of material, a take-up roller to receive used material, a drive to move the material across the stencil from the supply roller to the take-up roller, and a controllable tension device configured to vary a tension of the material when driving the material from the supply roller to the take-up roller.

Embodiments of the stencil printer further may include the controllable tension device having a brake mechanism configured to apply a pre-determined tension to the supply roller. The brake mechanism may include a disk secured to a shaft of the supply roller. The brake mechanism further may include a caliper assembly configured to apply a braking force on the disk. The caliper assembly may include a pneumatic brake caliper that is coupled to a controller to control the tension of the supply roller. The caliper assembly may include a first housing positioned on one surface of a frame member of the web-material supply module, a second housing positioned on an opposite surface of the frame member, and a piston that moves within a chamber formed within the first housing. The piston may be moved within the chamber of the first housing by an application of fluid provided by a fitting secured to the first housing and in fluid communication with the chamber. The caliper assembly further may include a first friction puck positioned in the chamber of the first housing and movable by the piston toward the disk when assembled. The caliper assembly further may include a second friction puck positioned within a chamber of the second housing. The first friction puck may be positioned next to the piston within the first housing and movable by the piston to selectively engage an outboard surface of the disk, and the second friction puck may be fixed within the second housing and configured to engage an inboard surface of the disk. The controllable tension device further may include a first encoder associated with a shaft of an idler roller of the web-material supply module, a second encoder associated with the supply roller, and a controller coupled to the first encoder and the second encoder. The controller may be configured to count a rotation of the first encoder and to count a rotation of the second encoder to determine a ratio between the rotation of the first encoder and the rotation of the second encoder, and to use this information to determine a diameter of the supply roller.

Another aspect of the disclosure is directed to a web-material supply module of a stencil wiper assembly for wiping a stencil of a stencil printer. In one embodiment, the module comprises a supply roller to receive a roll of material, a take-up roller to receive used material, and a drive to move the material across the stencil from the supply roller to the take-up roller. The module further comprises a controllable tension device configured to vary a tension of the material when driving the material from the supply roller to the take-up roller.

Embodiments of the web-material supply module further may include the controllable tension device having a brake mechanism configured to apply a pre-determined tension to the supply roller. The brake mechanism may include a disk secured to a shaft of the supply roller. The brake mechanism further may include a caliper assembly configured to apply a braking force on the disk. The caliper assembly may include a pneumatic brake caliper that is coupled to a controller to control the tension of the supply roller. The caliper assembly may include a first housing positioned on one surface of a frame member of the web-material supply module, a second housing positioned on an opposite surface of the frame member, and a piston that moves within a chamber formed within the first housing. The caliper assembly further may include a first friction puck positioned in the chamber of the first housing and movable by the piston toward the disk when assembled, and a second friction puck positioned within a chamber of the second housing. The first friction puck may be positioned next to the piston within the first housing and movable by the piston to selectively engage an outboard surface of the disk, and the second friction puck may be fixed within the second housing and configured to engage an inboard surface of the disk. The controllable tension device further may include a first encoder associated with a shaft of an idler roller of the web-material supply module, a second encoder associated with the supply roller, and a controller coupled to the first encoder and the second encoder. The controller may be configured to count a rotation of the first encoder and to count a rotation of the second encoder to determine a ratio between the rotation of the first encoder and the rotation of the second encoder, and to use this information to determine a diameter of the supply roller.

Yet another aspect of the disclosure is directed to a method for controlling tension of a supply roller within a web-material supply module of a stencil wiper assembly designed to wipe a stencil of a stencil printer. The method comprises moving the material between a supply roller and a take-up roller, and controlling a tension of the material when driving material from the supply roller to the take-up roller. In one embodiment, controlling a tension of the material may be achieved by a controllable tension device including a brake mechanism configured to apply a pre-determined tension to the supply roller.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
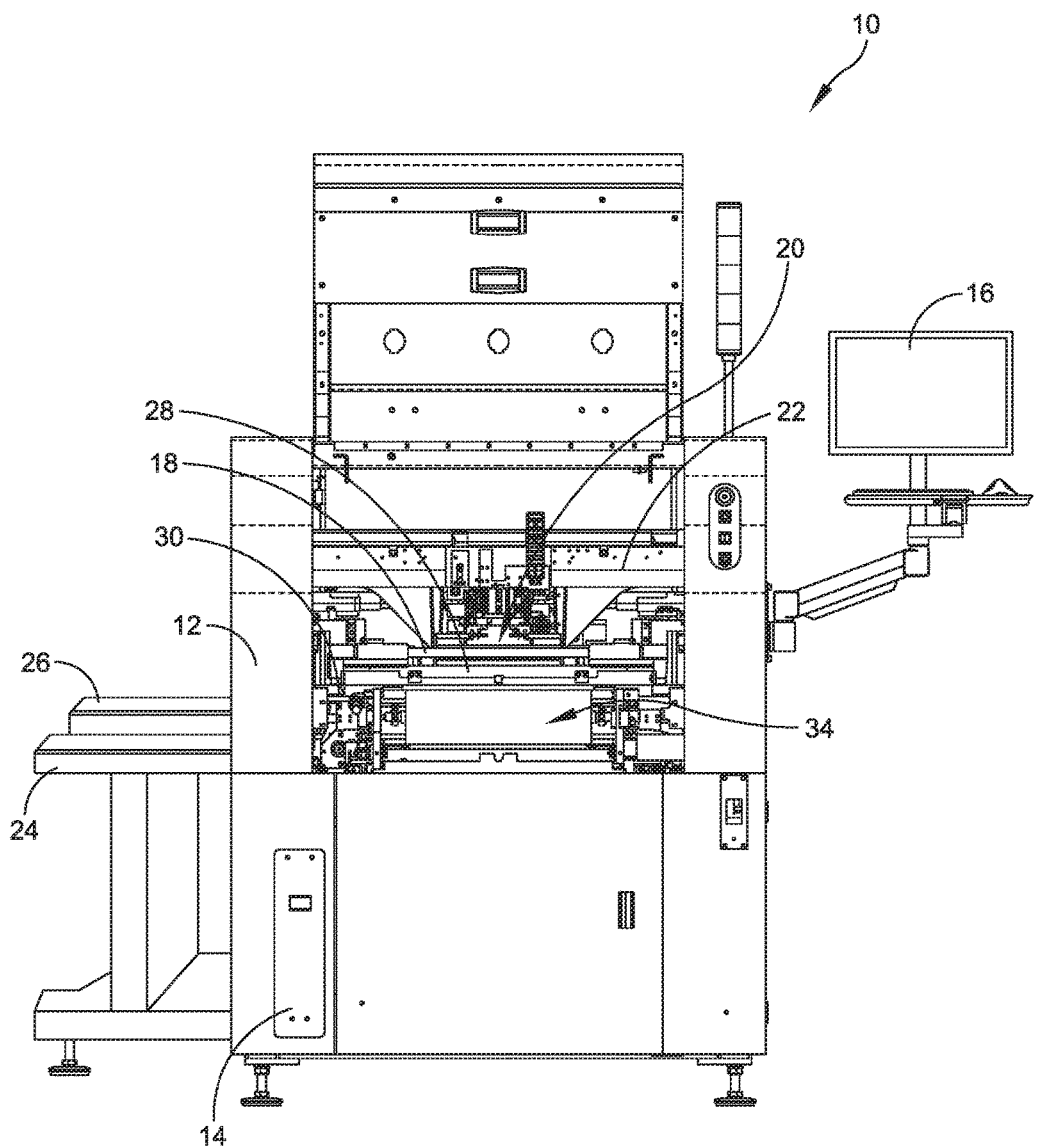
FIG. 1 is a front perspective view of a stencil printer in accordance with some embodiments of the disclosure.

The concepts described in the present disclosure are not limited in their application to the details of construction and the arrangement of components set forth in the following description or illustrated in the drawings. The embodiments described herein may be achieved by other embodiments and may be practiced or carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the disclosure will now be described with reference to a stencil printer used to print solder paste onto a circuit board. One skilled in the art will appreciate, however, that embodiments of the disclosure are not limited to stencil printers that print solder paste onto circuit boards, but rather, may be used in other applications requiring dispensing of other viscous materials, such as glues and encapsulents. Further, stencil printers in accordance with embodiments of the disclosure are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Embodiments of the present disclosure are directed to a controllable tension device for a stencil wiper assembly that enables a variable friction force to be applied to a paper roll assembly (supply roller) to maintain a pre-determined paper tension while the roll diameter changes from a maximum diameter to an empty core. In one embodiment, the controllable tension device is a closed loop system that enables software and applications tools to provide greater control over the stencil cleaning process.

Referring now to the drawings, and more particularly to FIG. 1, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head assembly or print head, generally indicated at 20, which is configured to apply the solder paste in a manner described in greater detail below.

As shown in FIG. 1 and described below, the stencil and the print head may be suitably coupled or otherwise connected to the frame 12. In one embodiment, the print head 20 may be mounted on a print head gantry 22, which may be mounted on the frame 12. The print head gantry 22 enables the print head 20 to be moved in the y-axis direction under the control of the controller 14 and to apply pressure on the print head as it engages the stencil 18. In a certain embodiment, the print head 20 may be placed over the stencil 18 and may be lowered in the z-axis direction into contact and sealingly engage the stencil.

The stencil printer 10 may also include a conveyor system having rails 24, 26 for transporting a printed circuit board (sometimes referred to as a "printed wiring board," "substrate," or "electronic substrate" herein) to a print position in the stencil printer. The rails 24, 26 sometimes may be referred to herein as a "tractor feed mechanism," which is configured to feed, load or otherwise deliver circuit boards to the working area of the stencil printer, which may be referred to herein as a "print nest," and to unload circuit boards from the print nest.

The stencil printer 10 has a support assembly 28 to support the circuit board, which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head 20 may be configured to receive solder paste from a source, such as a dispenser, e.g., a solder paste cartridge, that provides solder paste to the print head during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board is loaded into the stencil printer 10 using the conveyor rails 24, 26. The support assembly 28 raises and secures the circuit board to a print position. The print head 20 is then lowered in the z-axis direction until the blades of the print head contact the stencil 18 at a desired pressure. The print head 20 is then moved in the y-axis direction across the stencil 18 by the print head gantry 22. The print head 20 deposits solder paste through apertures in the stencil 18 and onto the circuit board. Once the print head has fully traversed the stencil 18 across the apertures, the print head is lifted off the stencil and the circuit board is lowered back onto the conveyor rails 24, 26. The circuit board is released and transported from the stencil printer 10 so that a second circuit board may be loaded into the stencil printer. To print on the second circuit board, the print head is lowered in the z-axis direction into contact with the stencil and moved across the stencil 18 in the direction opposite to that used for the first circuit board.

Figure 2:
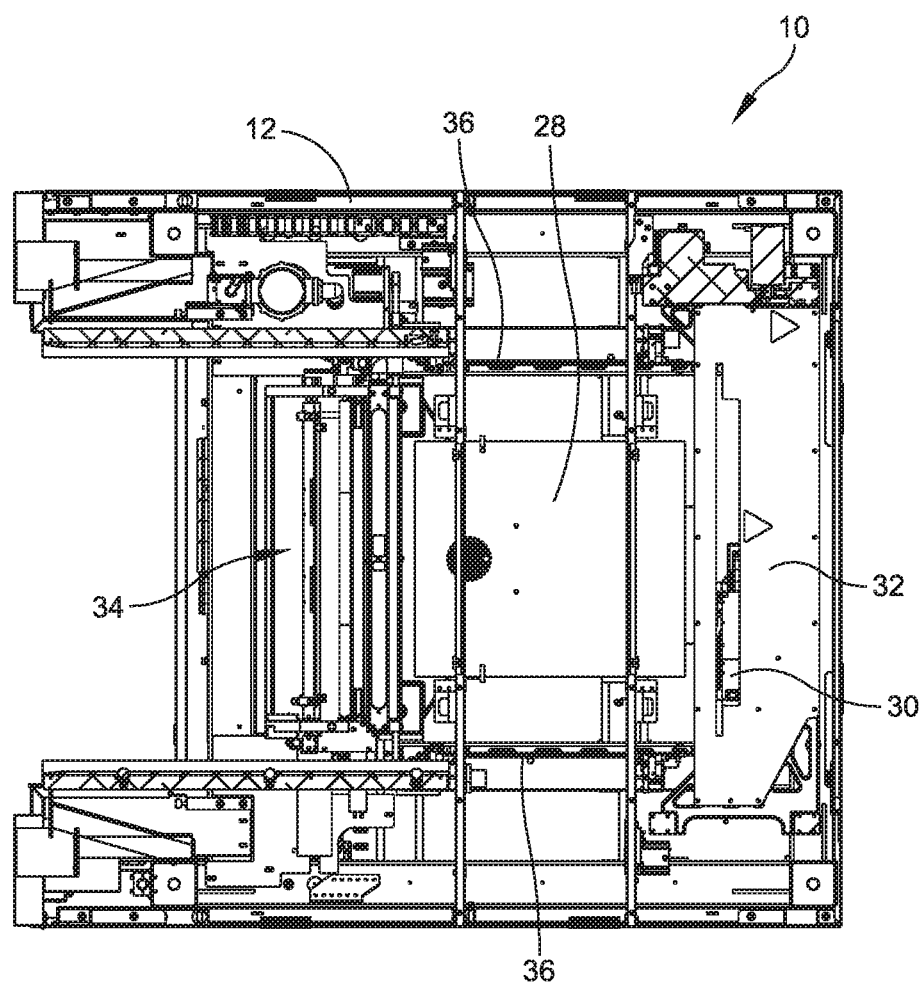
FIG. 2 is a top plan view of the stencil printer illustrated in FIG. 1 with portions removed to illustrate a stencil wiper assembly in accordance with an embodiment of the disclosure.

Referring additionally to FIG. 2, an imaging system 30 may be provided for the purposes of aligning the stencil 18 with the circuit board prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board to capture an image of predefined areas of the circuit board or the stencil, respectively.

After one or more applications of the solder paste to circuit boards, excess solder paste may accumulate at the bottom of the stencil 18 and a stencil wiper assembly may move beneath the stencil to remove the excess solder paste. In other embodiments, the stencil 18 may be moved over the stencil wiper assembly.

FIG. 2 is a schematic top view of the stencil printer 10 shown in FIG. 1 showing a stencil wiper assembly, generally indicated at 34, in accordance with some embodiments of the disclosure. In one embodiment, the stencil wiper assembly 34 may be mounted on a pair of rails, each indicated at 36, and situated at one end of the stencil. According to one embodiment of the disclosure, the stencil wiper assembly 34 rides on linear rails 36 and may be moved back and forth using a lead screw. Alternatively, a motor and belt, mechanism may be used to reciprocate the stencil wiper assembly 34, as well as chain and pulley linear motor, or by an alternative mechanism, such as a linear brushless motor drive or a rack and pinion drive. In another embodiment, the stencil wiper assembly 34 may also stay stationary as the stencil 18 is moved over the assembly to perform the cleaning operation. In yet another embodiment, the stencil wiper assembly 34 can be provided on a lift assembly that is configured to lift the stencil wiper assembly toward and away from the stencil 18 for cleaning.

Figure 3:
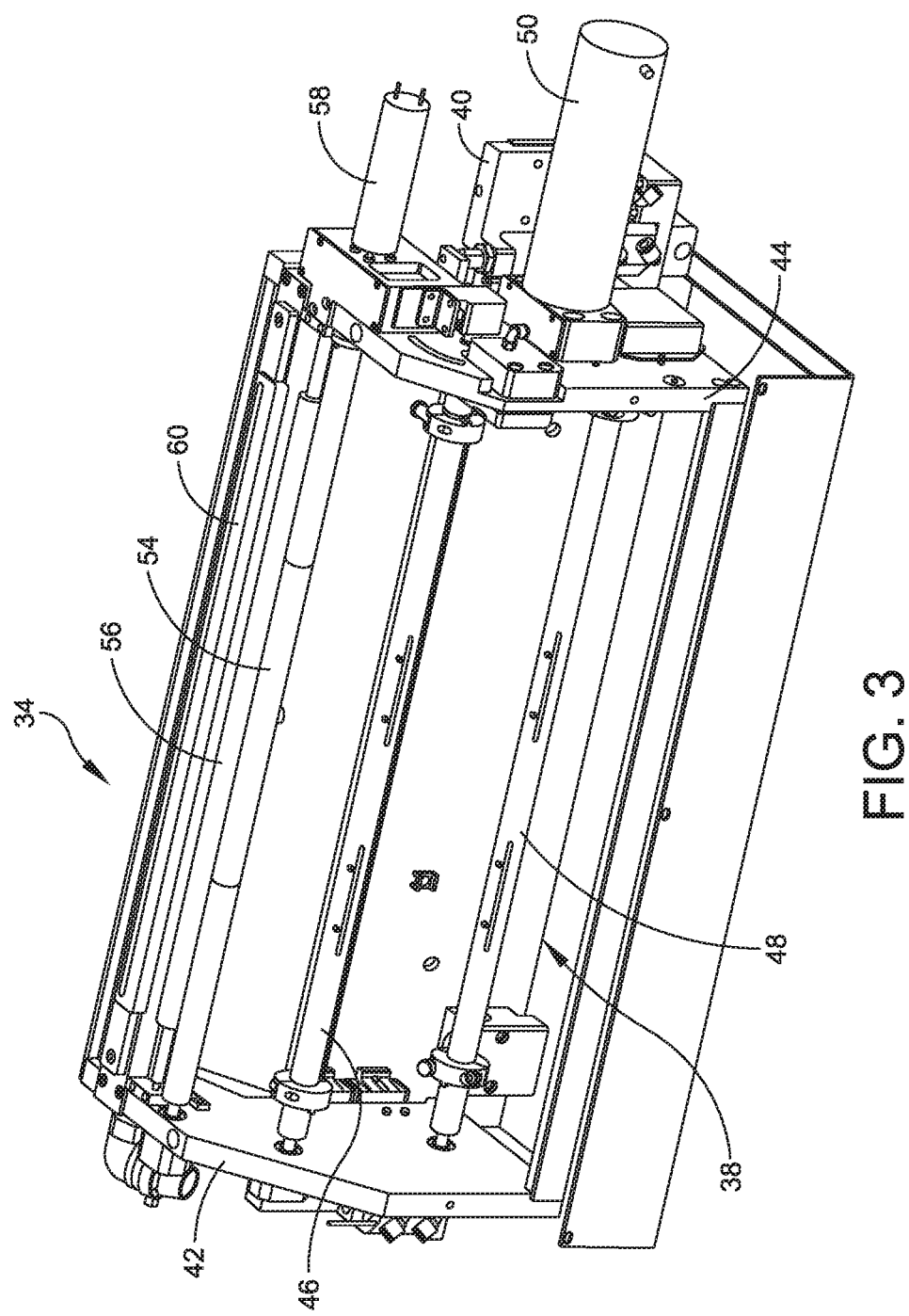
FIG. 3 is a perspective view of the stencil wiper assembly in accordance with some embodiments of the disclosure.
Figure 4:
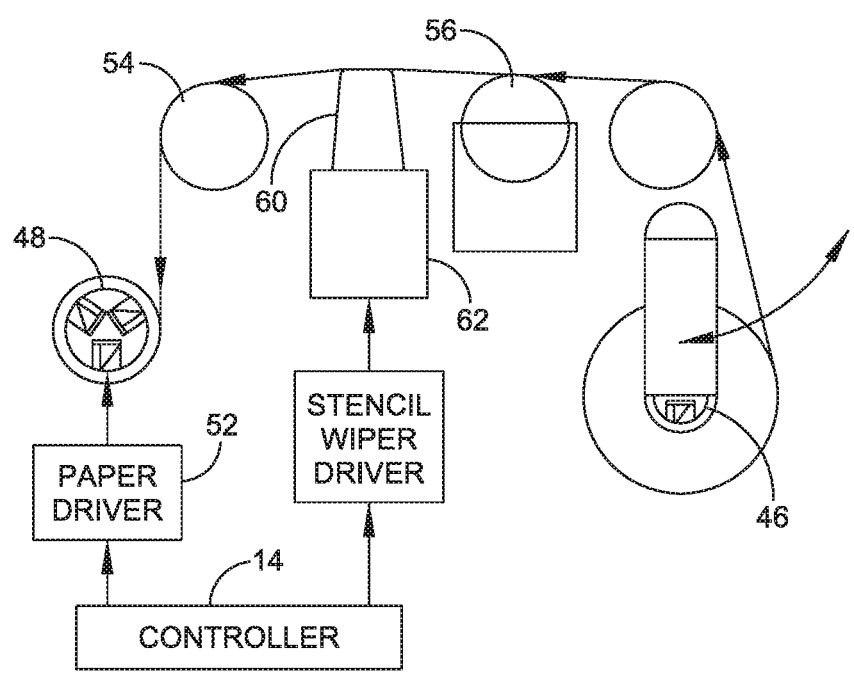
FIG. 4 is a diagrammatic representation of the stencil wiper assembly in accordance with some embodiments of the disclosure.

Referring to FIGS. 3 and 4, which show an example stencil wiper assembly 34 in greater detail, there is generally indicated at 38 a web-material supply module to enable an operator to quickly replace the web-material supply. As shown, in addition to the web-material supply module 38, the stencil wiper assembly 34 further includes a lift cylinder mounting bracket 40, which when used with a lift assembly is used to secure the web-material supply module to the lift assembly. Alternatively, brackets may be provided to secure the web-material supply module to the rails to move the stencil wiper assembly along the rails. A solvent drip tray (not designated) may be provided to capture solvent used to wet web-material.

In the shown embodiment, the web-material supply module 38 includes a first frame member 42, a second frame member 44, a supply roller 46 to receive a roll of web-material, and a take-up roller 48 to receive the used web-material after the module cleans the underneath of the stencil 18. The supply roller 46 may be constructed and arranged to receive the roll of web-material over the supply roller in a secure position with respect to the supply roller. In one example, the roll of web-material may be purchased from any vendor of such materials, such as from JNJ Industries, Inc. of Franklin, Mass. The roll of web-material may include a web-material core (e.g., a cardboard tube) around which a supply of web-material may be wrapped. An empty web-material core may be initially placed around the take-up roller 48 so that used web-material may be wrapped around the core for disposal. In some implementations, the web-material initially may be disposed between the supply roller 46 and take-up roller 48 and affixed to the take-up roller using a tape. It should be understood that web-material may include any material used to wipe the stencil 18, including paper.

A web-material winder motor 50 having a web-material driver 52 may be mechanically connected to the take-up roller 48 to rotate the take-up roller in the direction depicted by arrows representing the web-material in FIG. 4. In some embodiments, the web-material driver 52 may communicate with the controller 14 of the stencil printer 10 to move web-material from the supply roller 46 to the take-up roller 48 over two idler rollers, each indicated at 54.

In some embodiments, the stencil wiper assembly 34 further may include a fluid delivery assembly embodying a hollow solvent tube 56 with numerous small openings formed along the length of the tube for wetting the web-material as the web-material travels over the solvent tube. A motor 58 can be provided to drive the rotation of the solvent tube 56. The stencil wiper assembly 34 further may include a wiper blade having a vacuum plenum 62 to remove excess moisture and hardened solder paste from the web-material and the stencil as the web-material travels underneath the stencil 18. As shown, the idler roller 54 may be positioned between the solvent tube 56 and the wiper blade 60 and the take-up roller 48. The stencil wiper assembly 34 may be designed to move the wiper blade 60 between a non-engaged position in which the web-material is spaced away from the stencil 18 to an engaged position in which the wiper blade forces the web-material upwards to engage the stencil to clean the stencil. The controller 14 may send a signal to a stencil wiper driver 64 to move the stencil wiper 60 and/or vacuum plenum 62 to the engaged and non-engaged positions.

As shown, the first and second frame members 42, 44 are provided to support the various components of the web-material supply module 38 in the manner illustrated in FIG. 3, including the supply roller 46, the idler rollers 54, the solvent tube 56, the wiper blade 60, and the take-up roller 48.

During a cleaning operation, the web-material winder motor 50 rotates the web-material supply roller 46 by driving the rotation of the take-up roller 48. The web-material passes over the solvent tube 56, which is filled with solvent by a solvent pump (not shown) and may be driven by the solvent tube motor 58. The release of solvent on the web-material is achieved by providing solvent under pressure within the solvent tube 56, which causes the solvent tube to squirt solvent through its numerous holes onto the web-material as it passes the solvent tube. Another approach to wetting the web-material is by providing a cylindrical structure that rotates within a solvent bath to wet the web-material as the web-material travels over the cylindrical structure. In some embodiments, the solvent impregnated web-material may be passed over the wiper blade 60, which holds the web-material in place as the stencil wiper assembly moves underneath the stencil 18 or as the stencil moves over the stencil wiper assembly, as the case may be, thereby cleaning the stencil. The vacuum plenum 62 may be provided to suck or otherwise draw material from the stencil via the web-material. Used or spent material is rolled on the take-up roller 48.

In one embodiment, the web-material supply module 38 may include a pivot mechanism to pivot the supply roller 46 between operating and changing positions. Specifically, the pivot mechanism may include at least one and preferably a pair of arms that enable the pivot action of the supply roller 46. One end of each pivot arm may be rotatably attached to the supply roller 46 in any suitable manner, e.g., bearings, at the end of the supply roller. The other (opposite) end of each pivot arm may be pivotably attached to its respective frame member 42 or 44 in a similar manner. The arrangement is such that during operation of the stencil wiper assembly 34 to clean a stencil, the supply roller 46 is disposed below the idler roller 54, solvent tube 56 and stencil wiper 60. In this position, it is difficult, if not impossible, to replace an existing, used-up roll of web-material with a new roll of web-material. When depleted, the supply roller 46 can be pivoted into a changing position (not shown). This reduces cycle time as well as the frustration level of the operator having to replace the roll of web-material.

With the introduction of large diameter paper rolls, e.g., five-inch paper rolls, an additional torque associated with the large diameter roll has a tendency to create excessive paper tension for a clutch mechanism used to stop and start a rotation of the supply roller 46 by driving the rotation of the take-up roller 48. Current stencil wiper assemblies typically use a fixed torque slip clutch, which is insufficient for a larger supply roller diameter required in this application. As a result, paper delivered from the supply roller 46 can tear and cup, along with causing undesirable stresses on a shaft and a drive train of the web-material supply module 38.

Figure 5:
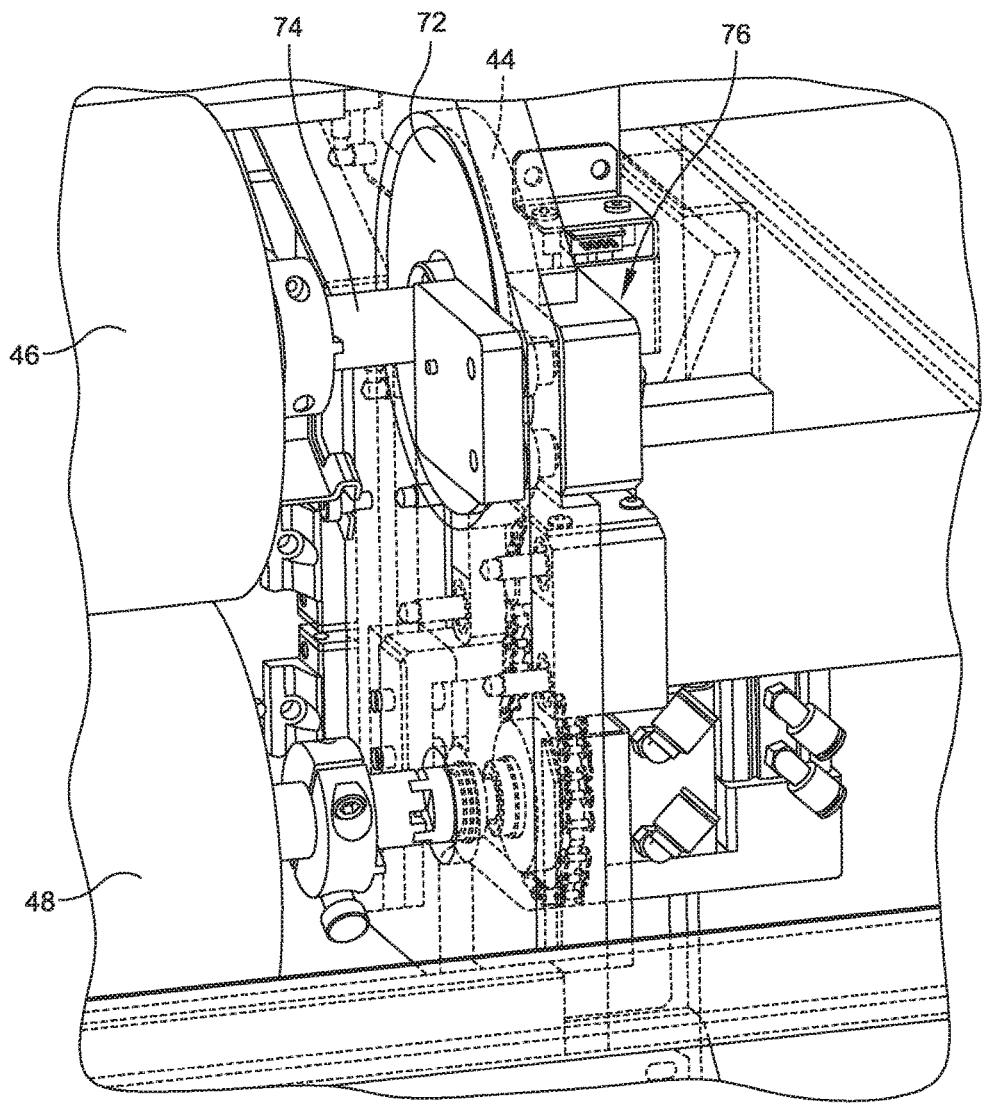
FIGS. 5-7 are enlarged perspective views of a controllable tension device of the stencil wiper assembly.
Figure 6:
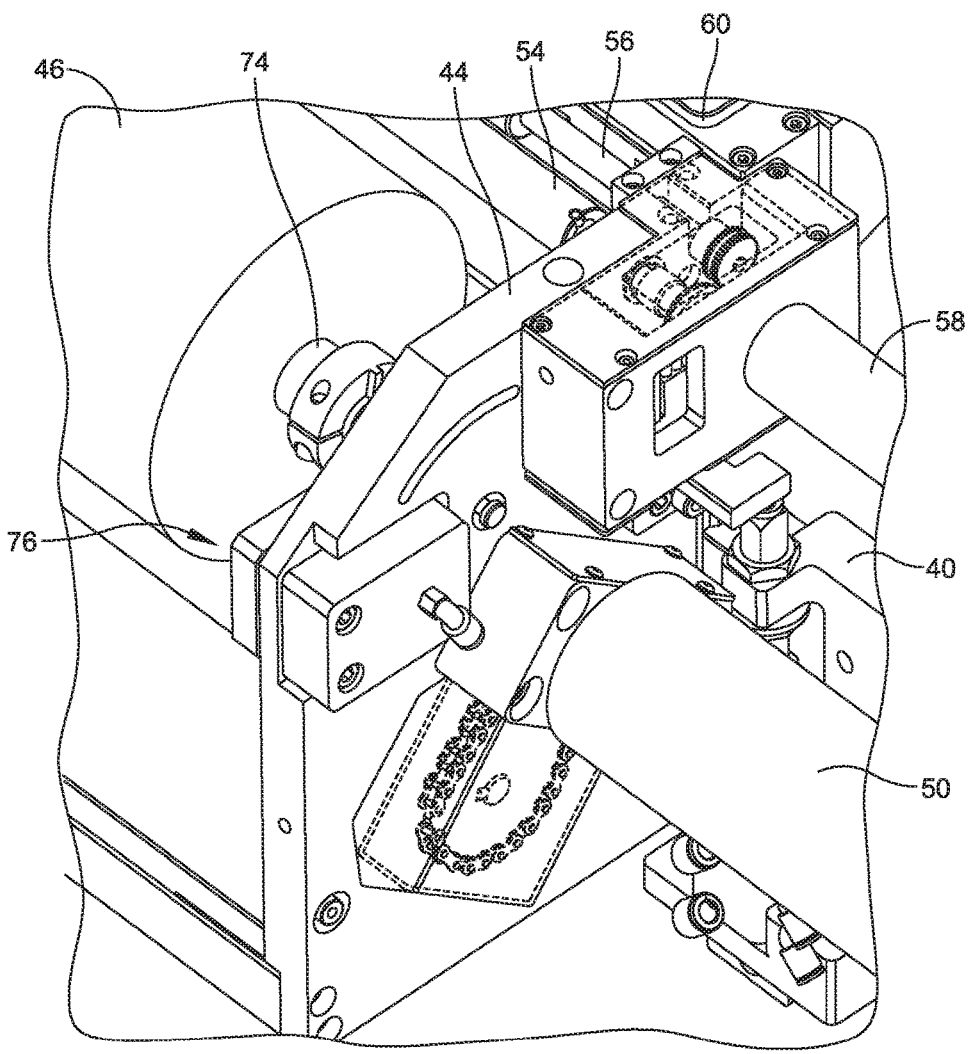
Figure 7:
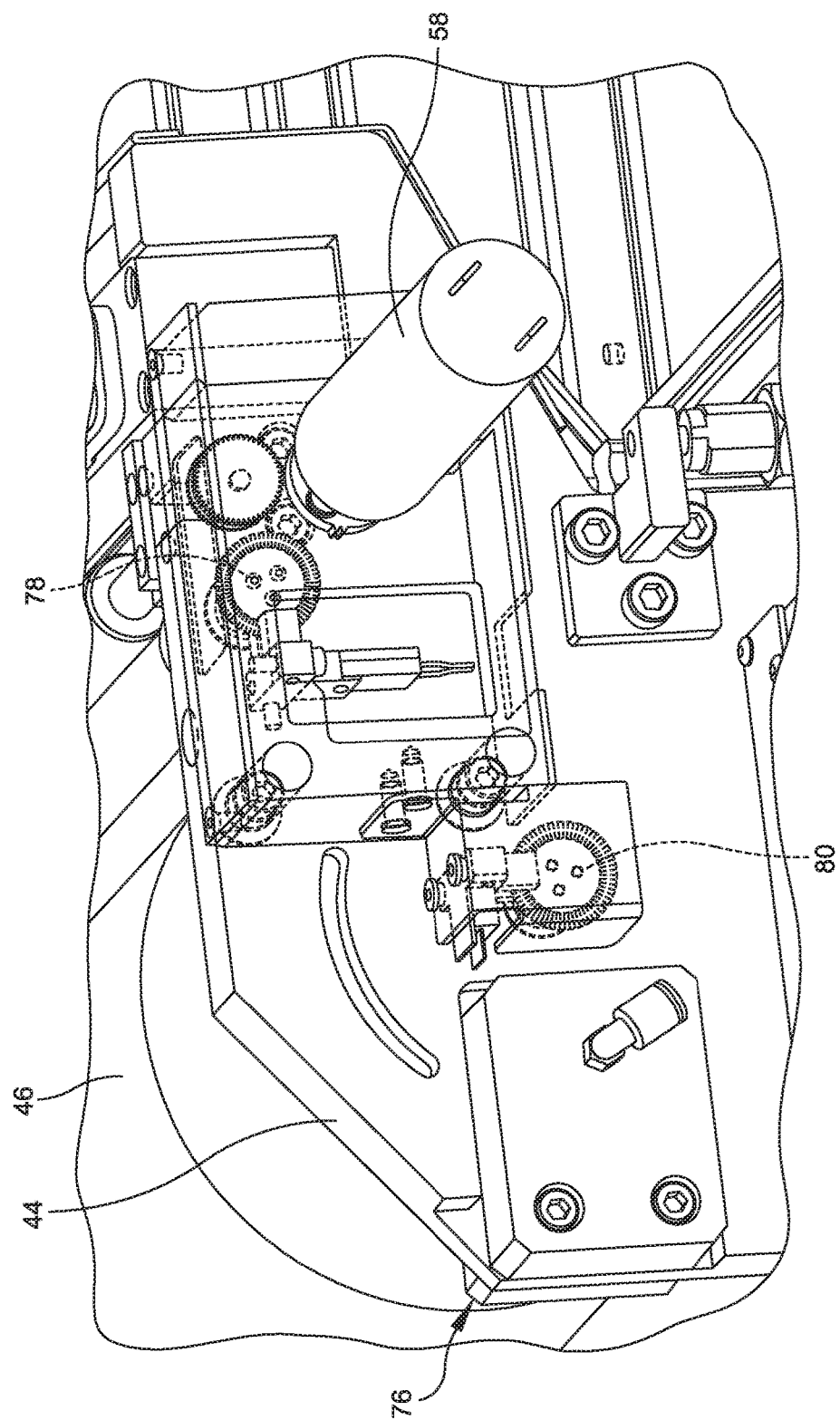

Referring now to FIGS. 5-7, and more particularly to FIG. 5, embodiments of the web-material supply module 38 of the stencil wiper assembly 34 are directed to a controllable tension device that is configured to provide a means to control and maintain a pre-determined paper tension through the use of a variable friction force that is controlled based on the changing diameter of the supply roller 46. As described above, the web-material winder motor 50 under the control of the web-material driver 52 and the controller 14 drives the rotation of the take-up roller 48 to rotate the take-up roller.

As shown in FIGS. 5 and 6, in one embodiment, the controllable tension device includes a brake mechanism configured to apply tension to the supply roller 46. The brake mechanism includes a disk 72 secured to a shaft 74 of the supply roller 46. The disk 72 can be considered a "rotor" in a typical brake mechanism. The brake mechanism further includes a caliper assembly, generally indicated at 76, to apply a braking force on the disk 72. In a certain embodiment, the caliper assembly 76 is a pneumatic brake caliper that is coupled to the controller 14 to control the tension of the supply roller 46.

The brake mechanism is configured to use the caliper assembly 76 to apply a force against the disk 72 to create friction that retards the rotation of the shaft 74 of the supply roller 46 either to reduce a rotational speed or to hold the supply roller stationary. The energy of motion is converted into waste heat. In some embodiments, the disk 72 can be fabricated from cast iron, but can be made from other materials, such as reinforced carbon or ceramic composites.

FIG. 7 illustrates the motor 50 from the web-material supply module 38 of the stencil wiper assembly 34 removed to reveal a first encoder 78 associated with a shaft of the idler roller 54 to count the rotation of the shaft of the idler roller. Embodiments of the present disclosure further include a second encoder 80 that is used to count the rotation of the supply roller 46. The addition of a second encoder 80 enables the determination of a ratio between a linear distance/paper out of the first encoder 78 on the shaft of the idler roller 54 and the second, brake encoder 80, and use this information to determine the feed roll diameter.

Figure 8:
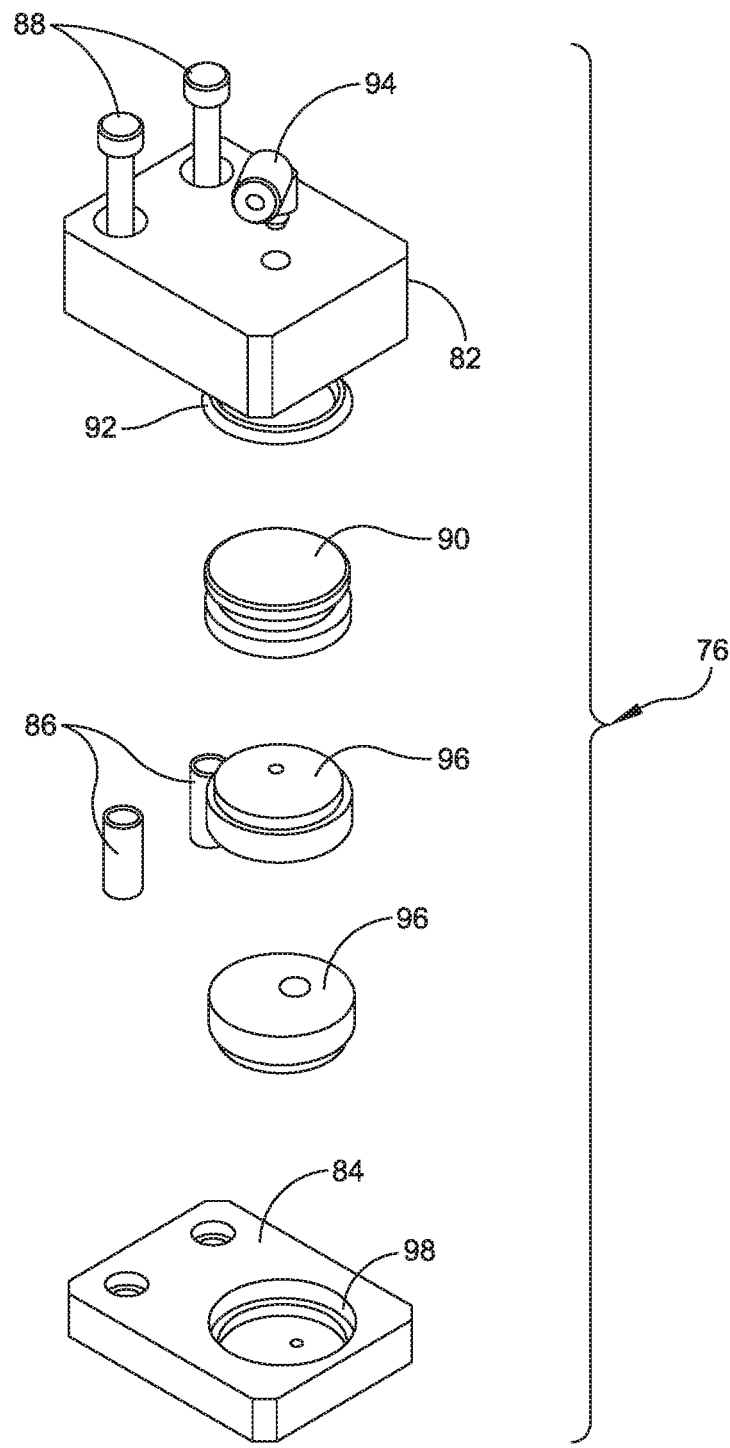
FIG. 8 is an exploded perspective view of a caliper assembly of the controllable tension device.

Referring additionally to FIG. 8, the caliper assembly 76 is shown in an exploded condition. As shown, caliper assembly 76 includes a first housing 82 that is positioned on an outer surface (outboard) of the second frame member 44 and a second housing 84 that is positioned on an inner surface (inboard) of the second frame member. Two spacers, each indicated at 86, and two screws, each indicated at 88, are provided to secure the first housing 82 to the second housing 84 through openings formed in the second frame member 44. The arrangement is such that the second housing 84 extends over the disk 72 to provide a resistance force to the disk and the shaft 74 of the supply roller 46 in the manner described below.

The caliper assembly 76 further includes a piston 90 that moves within a cylindrical chamber formed within the first housing. In one embodiment, the piston 90 includes an O-ring 92, and is moved by the application of a fluid provided by a fitting 94 secured to the first housing 82 and in fluid communication with the cylindrical chamber. In a preferred embodiment, the operation of the piston 90 is achieved by a pneumatic actuator that is controlled by the controller 14. The caliper assembly 76 further includes two friction pucks, each indicated at 96, with a first friction puck 96 being positioned in the cylindrical chamber of the first housing 82 and movable by the piston 90 and a second friction puck 96 being positioned within a cylindrical chamber 98 of the second housing 84. (It should be noted that the cylindrical chamber of the first housing 82 is similar if not identical to the cylindrical chamber of the second housing 84.) Specifically, the first friction puck 96 is positioned next to the piston 90 within the first housing 82, and is movable by the piston to selectively engage an outboard surface of the disk 72. The second friction puck 96 is fixed within the second housing 84, and is configured to engage an inboard surface of the disk 72.

The caliper assembly 76 is configured to apply a specific force through the use of a precision pneumatic regulator to the rotating disk 72 that is attached to the shaft 74 of the supply roller 46. The force applied to the disk 72 is controlled by software associated with the controller 14, which uses an algorithm to measure a ratio between a linear distance of the paper feed and an angular displacement of the supply roller 46 to determine roll diameter. Based on feedback, the algorithm can relate an amount of voltage to pressure to obtain a correct braking force on the caliper assembly 76 to maintain a pre-determined paper tension.

In another embodiment, a bias spring or other mechanism may be used to provide a steady state friction to the disk 72 to prevent loss of paper tension during power off conditions. In another embodiment, a servo motor may be used on the supply roller 46 to provide a controllable resistance torque instead of a friction brake. In yet another embodiment, another method of providing friction, such as an electromechanical brake, may be used at the supply roller 46 to provide controllable friction.

Figure 9:
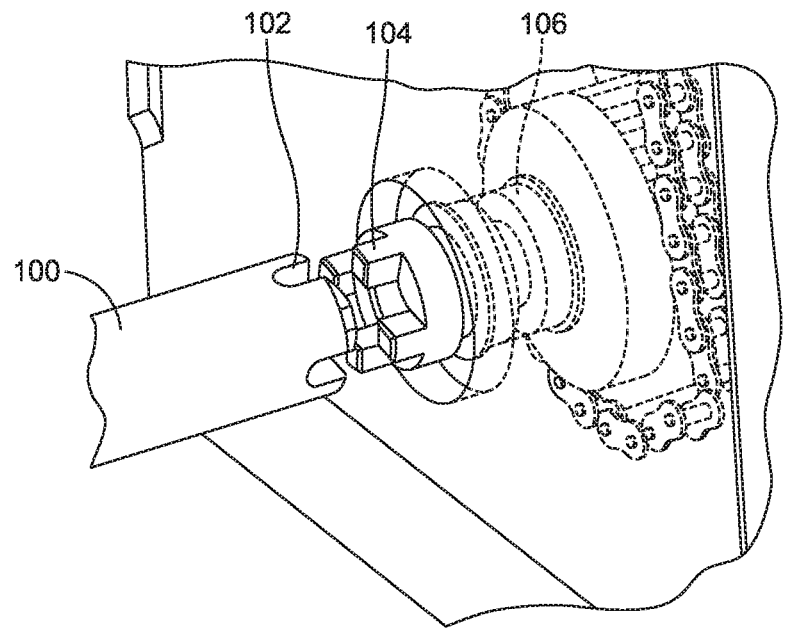
FIGS. 9 and 10 are enlarged perspective views of a portion of a supply shaft of a supply roller in an engaged (FIG. 9) and a disengaged (FIG. 10) condition.
Figure 10:
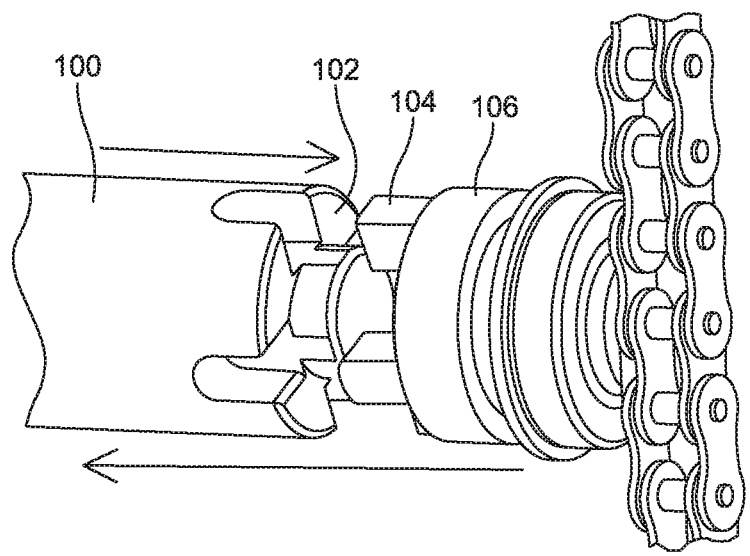

Referring to FIGS. 9 and 10, the web-material supply module 38 of the stencil wiper assembly 34 further includes a detachable coupling associated with a shaft 100 of the take-up roller 48. As shown, the shaft 100 includes a first coupling 102 associated with the shaft of the take-up roller and a second, mating coupling 104 associated with a shaft portion 106 that is secured to the second frame member 44 by a bearing. The first and second couplings 102, 104 are configured to move along an axis associated with the take-up roller 48 between a spaced apart, disengaged position and an interlocked, engaged position. FIGS. 9 and 10 illustrate the first and second couplings 102, 104 in the disengaged position prior to interconnecting tines or prongs of the couplings. The construction of the take-up roller 48 enables the take-up roller to be removed from the web-material supply module 38 to remove used paper from the take-up roller.

The provision of the first and second couplings 102, 104 of the take-up roller 48 eliminates current hardened steel pin/steel hub interface, and can handle an increased torque that the larger supply roller generates when transferring paper to the take-up roller. In one embodiment, the construction of the take-up roller 48 can be implemented in a manner similar to the supply roller 46 to include the first and second couplings 102, 104.

It should be observed that the brake mechanism of the controllable tension device of the web-material supply module 38 is capable of accurately controlling paper tension of the module from start to finish even with the change from a new paper supply roll to an empty core. In one embodiment, a method for controlling tension of the supply roller within the web-material supply module 38 of the stencil wiper assembly 34 designed to wipe the stencil 18 of the stencil printer 10 is disclosed. In one embodiment, the method includes moving the web-material between the supply roller 46 and the take-up roller 48, and controlling a tension of the web-material when driving material from the supply roller to the take-up roller. In a certain embodiment, controlling the tension of the web-material is achieved by the controllable tension device including the brake mechanism, which is configured to apply a pre-determined tension to the supply roller in the manner described above.

The components of the module are also easier to install for production.

In certain embodiments, the display 16 of the stencil printer can be configured with a "dashboard gas gauge" showing a percentage of media used or remaining on the paper supply roll. The ability to have a dashboard-type of control over the wiper paper is strongly desired.

Embodiments of the controllable tension device provide direct measurement of the roll diameter and/or width, direct measurement of the media tension, controlled brake, and dynamic braking.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A stencil printer comprising:
   a stencil;
   a material applicator to apply material on the stencil; and
   a stencil wiper assembly to selectively wipe the stencil, the stencil wiper assembly having a quick-change material module comprising
      a supply roller to receive a roll of material,
      a take-up roller to receive used material,
      a drive to move the material across the stencil from the supply roller to the take-up roller, and
      a controllable tension device configured to vary a tension of the material when driving the material from the supply roller to the take-up roller, the controllable tension device including a brake mechanism configured to apply a pre-determined tension to the supply roller, the brake mechanism including a disk secured to a shaft of the supply roller and a caliper assembly configured to apply a braking force on the disk, wherein the caliper assembly includes
         a first housing positioned on one surface of a frame member of the web-material supply module,
         a second housing positioned on an opposite surface of the frame member, and
         a piston that moves within a chamber formed within the first housing.

2. The stencil printer of claim 1, wherein the caliper assembly includes a pneumatic brake caliper that is coupled to a controller to control the tension of the supply roller.

3. The stencil printer of claim 1, wherein the piston is moved within the chamber of the first housing by an application of fluid provided by a fitting secured to the first housing and in fluid communication with the chamber.

4. The stencil printer of claim 1, wherein the caliper assembly further includes a first friction puck positioned in the chamber of the first housing and movable by the piston toward the disk when assembled.

5. The stencil printer of claim 4, wherein the caliper assembly further includes a second friction puck positioned within a chamber of the second housing, the first friction puck being positioned next to the piston within the first housing and movable by the piston to selectively engage an outboard surface of the disk, and the second friction puck being fixed within the second housing and configured to engage an inboard surface of the disk.

6. The stencil printer of claim 1, wherein the controllable tension device further includes a first encoder associated with a shaft of an idler roller of the web-material supply module, a second encoder associated with the supply roller, and a controller coupled to the first encoder and the second encoder, the controller being configured to count a rotation of the first encoder and to count a rotation of the second encoder to determine a ratio between the rotation of the first encoder and the rotation of the second encoder, and to use this information to determine a diameter of the supply roller.

7. A web-material supply module of a stencil wiper assembly for wiping a stencil of a stencil printer, the module comprising:
   a supply roller to receive a roll of material;
   a take-up roller to receive used material; and
   a drive to move the material across the stencil from the supply roller to the take-up roller; and
   a controllable tension device configured to vary a tension of the material when driving the material from the supply roller to the take-up roller, the controllable tension device including a brake mechanism configured to apply a pre-determined tension to the supply roller, the brake mechanism including a disk secured to a shaft of the supply roller and a caliper assembly configured to apply a braking force on the disk, wherein the caliper assembly includes
      a first housing positioned on one surface of a frame member of the web-material supply module,
      a second housing positioned on an opposite surface of the frame member, and
      a piston that moves within a chamber formed within the first housing.

8. The module of claim 7, wherein the caliper assembly includes a pneumatic brake caliper that is coupled to a controller to control the tension of the supply roller.

9. The module of claim 7, wherein the caliper assembly further includes a first friction puck positioned in the chamber of the first housing and movable by the piston toward the disk when assembled, and a second friction puck positioned within a chamber of the second housing, the first friction puck being positioned next to the piston within the first housing and movable by the piston to selectively engage an outboard surface of the disk, and the second friction puck being fixed within the second housing and configured to engage an inboard surface of the disk.

10. The module of claim 7, wherein the controllable tension device further includes a first encoder associated with a shaft of an idler roller of the web-material supply module, a second encoder associated with the supply roller, and a controller coupled to the first encoder and the second encoder, the controller being configured to count a rotation of the first encoder and to count a rotation of the second encoder to determine a ratio between the rotation of the first encoder and the rotation of the second encoder, and to use this information to determine a diameter of the supply roller.

11. A method for controlling tension of a supply roller within a web-material supply module of a stencil wiper assembly designed to wipe a stencil of a stencil printer, the method comprising:
   moving the material between a supply roller and a take-up roller, moving the material being achieved by a motor coupled to the take-up roller to drive a rotation of the take-up roller; and
   controlling a tension of the material when driving material from the supply roller to the take-up roller by a controllable tension device including a brake mechanism configured to apply a pre-determined tension to the supply roller, the brake mechanism including a disk secured to a shaft of the supply roller and a caliper assembly configured to apply a braking force on the disk, wherein the caliper assembly includes
      a first housing positioned on one surface of a frame member of the web-material supply module,
      a second housing positioned on an opposite surface of the frame member, and
      a piston that moves within a chamber formed within the first housing.

* * * * *